United States Patent [19]
Ronwin

[11] Patent Number: 5,879,472
[45] Date of Patent: Mar. 9, 1999

[54] OPTICAL CAVITY DEVICE

[76] Inventor: Edward Ronwin, P.O. Box 88746, Sioux Falls, S. Dak. 57109-1005

[21] Appl. No.: 61,213

[22] Filed: Apr. 16, 1998

Related U.S. Application Data

[63] Continuation-in-part of Ser. No. 789,283, Jan. 28, 1997.
[51] Int. Cl.[6] .................................................. H01L 25/00
[52] U.S. Cl. ......................... 136/246; 136/291; 250/216; 250/228
[58] Field of Search .................... 136/246, 291; 250/216, 228

[56] References Cited

U.S. PATENT DOCUMENTS 2,444,442  6/1948  Herbold ................................. 250/228

OTHER PUBLICATIONS

Meinel et al., "Applied Solar Energy", Addison–Wesley Publishing, pp. 461–483, 1976.

*Primary Examiner*—Mark Chapman

[57] ABSTRACT

An optical cavity device for converting concentrated light into electricity. The device includes an outlet compartment and a middle compartment. A passage connects the middle compartment and the outlet compartment together. A first shutter selectively opens and closes the passage. The middle compartment has an aperture that permits passage of outside light into the middle compartment where the light is concentrated. An inlet shutter permits selective opening and closing of the aperture in the middle compartment. A plurality of photoelectric cells for converting concentrated light into electricity are provided in the outlet compartment. Light is introduced into the middle compartment and permitted to continue to enter the middle compartment. Electricity is produced when a controlled quantity of light is allowed to pass from the middle compartment to the outlet compartment where the light is converted into electricity by the photoelectric cells.

21 Claims, 1 Drawing Sheet

OPTICAL CAVITY DEVICE

CROSS REFERENCE TO RELATED APPLICATION

This application is a continuation-in-part of my prior utility patent application Ser. No. 08/789,283, filed Jan. 28, 1997.

BACKGROUND OF THE INVENTION

1. Field of the Invention

The present invention relates to photoelectric devices and more particularly pertains to a new optical cavity device for converting concentrated light into electricity.

2. Description of the Prior Art

The use of photoelectric devices is known in the prior art. More specifically, photoelectric devices heretofore devised and utilized are known to consist basically of familiar, expected and obvious structural configurations, notwithstanding the myriad of designs encompassed by the crowded prior art which have been developed for the fulfillment of countless objectives and requirements.

Known prior art photoelectric devices include U.S. Pat. No. 2,444,442; U.S. Pat. No. 3,447,462; U.S. Pat. No. 4,999,060; U.S. Pat. No. 4,892,409; U.S. Pat. No. 3,097,563; U.S. Pat. No. 4,911,257; U.S. Pat. No. 5,059,254; U.S. Pat. No. 4,987,729; U.S. Pat. No. 4,150,898; and U.S. Pat. No. 1,897,219.

While these devices fulfill their respective, particular objectives and requirements, the aforementioned patents do not disclose a new optical cavity device. In particular, the aforementioned devices do not disclose an apparatus for concentrating light for conversion to electrical energy. To achieve this, the inventive device includes an outlet compartment and a middle compartment. A passage connects the middle compartment and the outlet compartment together. A first shutter selectively opens and closes the passage. The middle compartment has an aperture that permits passage of outside light into the middle compartment where the light is concentrated. An inlet shutter permits selective opening and closing of the aperture in the middle compartment. A plurality of photoelectric cells for converting concentrated light into electricity are provided in the outlet compartment. Light is introduced into the middle compartment and permitted to continue to enter the middle compartment. Electricity is produced when a controlled quantity of light is allowed to pass from the middle compartment to the outlet compartment where the light is converted into electricity by the photoelectric cells.

In particular, the invention is a device which uses concentrated light energy rather than chemical energy and utilizes captured photon densities above that available from average, incidental sunlight or ordinary levels of artificial light.

Other prior art devices utilize chemically-based batteries which supply electricity to power various devices. While those batteries have found many applications, they are characterized by many deficiencies and shortcomings including gradual deterioration of the chemical components, particularly on frequent use and recharge.

In these respects, the optical cavity device according to the present invention substantially departs from the conventional concepts and designs of the prior art, and in so doing provides an apparatus primarily developed for the purpose of converting concentrated light into electricity.

SUMMARY OF THE INVENTION

In view of the foregoing disadvantages inherent in the known types of photoelectric devices now present in the prior art, the present invention provides a new optical cavity device construction wherein the same can be utilized for converting concentrated light into electricity. In particular, the invention is a device which uses concentrated light energy rather than chemical energy and utilizes captured photon densities above that available from average, incidental sunlight at its maximum photon density at the earth's surface. The concentrated light is later used in aliquots which are aimed at photoelectric cells to generate electricity.

The general purpose of the present invention, which will be described subsequently in greater detail, is to provide a new optical cavity device apparatus and method which has many of the advantages of the photoelectric devices mentioned heretofore and many novel features that result in a new optical cavity device which is not anticipated, rendered obvious, suggested, or even implied by any of the prior art photoelectric devices, either alone or in any combination thereof.

To attain this, the present invention generally comprises an outlet compartment and a middle compartment. A passage connects the middle compartment and the outlet compartment together. A first shutter selectively opens and closes the passage. The middle compartment has an aperture that permits passage of outside light into the middle compartment where the light is concentrated. An inlet shutter permits selective opening and closing of the aperture in the middle compartment. A plurality of photoelectric cells for converting concentrated light into electricity are provided in the outlet compartment. Light is introduced into the middle compartment and permitted to continue to enter the middle compartment. Electricity is produced when a controlled quantity of light is allowed to pass from the middle compartment to the outlet compartment where the light is converted into electricity by the photoelectric cells.

There has thus been outlined, rather broadly, the more important features of the invention in order that the detailed description thereof that follows may be better understood, and in order that the present contribution to the art may be better appreciated. There are additional features of the invention that will be described hereinafter and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the foregoing abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

It is therefore an object of the present invention to provide a new optical cavity device apparatus and method which has many of the advantages of the photoelectric devices mentioned heretofore and many novel features that result in a new optical cavity device which is not anticipated, rendered obvious, suggested, or even implied by any of the prior art photoelectric devices, either alone or in any combination thereof.

It is another object of the present invention to provide a new optical cavity device which may be easily and efficiently manufactured and marketed.

It is a further object of the present invention to provide a new optical cavity device which is of a durable and reliable construction.

An even further object of the present invention is to provide a new optical cavity device which is susceptible of a low cost of manufacture with regard to both materials and labor, and which accordingly is then susceptible of low prices of sale to the consuming public, thereby making such optical cavity device economically available to the buying public.

Still yet another object of the present invention is to provide a new optical cavity device which provides in the apparatuses and methods of the prior art some of the advantages thereof, while simultaneously overcoming some of the disadvantages normally associated therewith.

Still another object of the present invention is to provide a new optical cavity device for converting concentrated light into electricity.

Yet another object of the present invention is to provide a new optical cavity device which includes an outlet compartment and a middle compartment. A passage connects the middle compartment and the outlet compartment together. A first shutter selectively opens and closes the passage. The middle compartment has an aperture that permits passage of outside light into the middle compartment where the light is concentrated. An inlet shutter permits selective opening and closing of the aperture in the middle compartment. A plurality of photoelectric cells for converting concentrated light into electricity are provided in the outlet compartment. Light is introduced into the middle compartment and permitted to continue to enter the middle compartment. Electricity is produced when a controlled quantity of light is allowed to pass from the middle compartment to the outlet compartment where the light is converted into electricity by the photoelectric cells.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be made to the accompanying drawings and descriptive matter in which there are illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein.

DESCRIPTION OF THE PREFERRED EMBODIMENT

Figure 1:
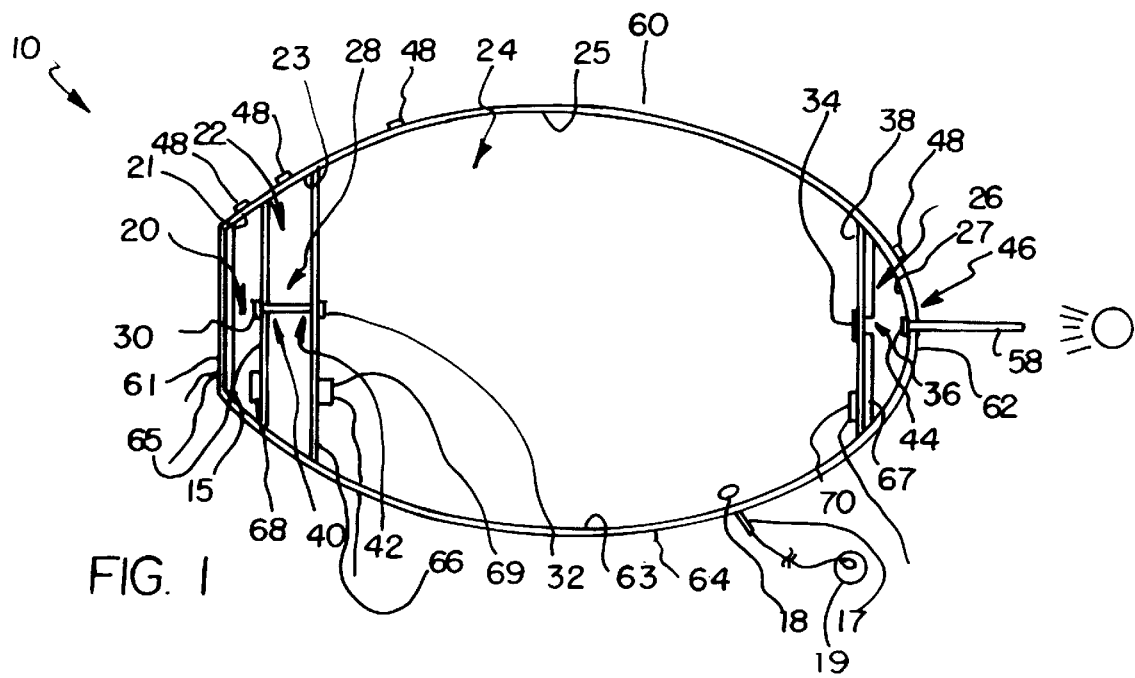
FIG. 1 is a cross-sectional view of a new optical cavity device according to the present invention.
Figure 2:
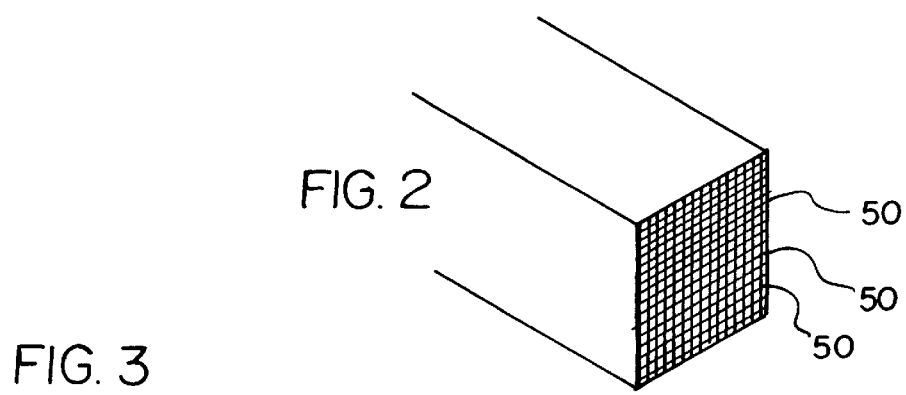
FIG. 2 is a partial perspective view of a plurality of tubes that extend between the middle compartment and the outlet compartment of the present invention.
Figure 3:
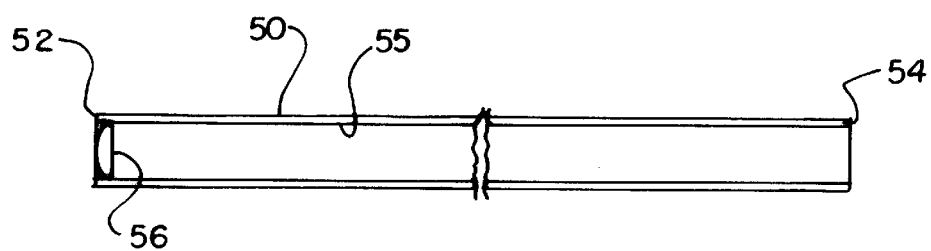
FIG. 3 is a cross-sectional view of a single tube of the present invention.

With reference now to the drawings, and in particular to FIGS. 1 through 3 thereof, a new optical cavity device embodying the principles and concepts of the present invention and generally designated by the reference numeral 10 will be described.

As best illustrated in FIGS. 1 through 3, the optical cavity device 10 for converting concentrated light into electricity comprises an outlet compartment 20 and a middle compartment 24. A passage 28 connects the middle compartment 24 and the outlet compartment 20 together. A first shutter 30 selectively opens and closes the passage 28. The middle compartment 24 has an aperture 46 that permits passage of outside light into the middle compartment 24 where the light is concentrated. An inlet shutter 36 permits selective opening and closing of the aperture 46 in the middle compartment 24. A plurality of photoelectric cells 15 for converting concentrated light into electricity are provided in the outlet compartment 20. Light is introduced into the middle compartment 24 and permitted to continue to enter the middle compartment 24. Electricity is produced when a controlled quantity of light is allowed to pass from the middle compartment 24 through the passage 28 into the outlet compartment 20 where the light is converted into electricity by the photoelectric cells 15.

Preferably, the middle and outlet compartments 24,20 have inner surfaces 25,21 and the passage 28 has an inner surface (not shown). The inner surfaces 25,21 of the storage and outlet compartments 24,20 and the inner surface of the passage 28 are covered with a non-light absorbing material. The first and inlet shutters 30,36 are also covered with a non-light absorbing material.

Also preferably, the passage 28 connecting the outlet compartment 20 and the middle compartment 24 comprises a staging compartment 22. In such an embodiment, a first orifice 40 connects the outlet compartment 20 and the staging compartment 22 together. Also, a second orifice 42 connects the middle compartment 24 and the staging compartment 22 together. The staging compartment may also have an inner surface 23 that is covered with a non-light absorbing material. Preferably, the staging compartment 22 has an inner surface that is covered with a non-light absorbing material.

Even more preferably, the passage 28 connecting the outlet compartment 20 and the middle compartment 24 comprises a tube 50. Most preferably, the passage 28 connecting the outlet compartment 20 and the middle compartment 24 comprises a plurality of tubes 50. In such an embodiment, each of the tubes 50 has a first end 52, a second end 54, and a hollow interior. The first end of each of the tubes 50 is positioned towards the photoelectric cells 15. Ideally, each of the tubes 50 has a magnifying lens 56 positioned in the hollow interior of each tube 50 towards the first end 52 of each tube 50. Preferably, each tube 50 has an inner surface that is covered with a non-light absorbing material.

Preferably, a second shutter 32 selectively opens and closes the second orifice 42. The first shutter 30 selectively opens and closes the first orifice 40. Preferably, the second shutter 32 is covered with a non-light absorbing material.

Also preferably, a wall 38 defines a portion of the middle compartment 24 as an inlet compartment 26. The wall 38 has an aperture 44 that extends through it to permit passage of light from the inlet compartment 26 to the middle compartment 24. The inlet compartment 26 is positioned away from the outlet compartment 20. Preferably, the wall 38 is covered with a non-light absorbing material It is preferred that a light density measuring device 17 for measuring light density in the middle compartment 24 be included in the invention. Ideally, the light density measuring device 17 has a sensor 18 that is positioned in the middle compartment 24. A light density meter 19 is operatively coupled to the light density measuring device 17.

Preferably, a plurality of valved openings 48 are included in the optical cavity device 10. A valved opening 48 opens into the middle compartment 24. Another valved opening 48 opens into the outlet compartment 20. Ideally, another valved opening 48 opens into the staging compartment 22 and still yet another valved opening 48 opens into the inlet compartment 26. The valved openings 48 are designed to permit removal of air from the various individual compartments 20,22,24,26 or to introduce a gas into the compartments 20,22,24,26. Preferably, the valves (not shown) closing the valved openings 48 are covered with a non-light absorbing material Preferably, a light-transferring means 58 transfers light from a light source 1 into the middle compartment 24. The light-transferring means 58 extends through the aperture in the middle compartment 24. Even more preferably, the light-transferring means 58 resists passage of light out of the middle compartment 24.

Ideally, the light-transferring means 58 comprises at least one optical fiber. Even more ideally, the light-transferring means 58 comprises a plurality of optical fibers.

The most preferred embodiment of the optical cavity device 10 comprises a container 60 with opposite first and second ends 61,62 and inner and outer surfaces 63,64. The inner surface 63 of the container 60 defines a cavity. Preferably, the inner surface 63 of the container 60 is covered with a non-light absorbing material.

As illustrated in FIG. 1, first, second, and third dividing walls 65,66,67 are disposed in the cavity. Each of the dividing walls 65,66,67 has an orifice 40,42,44 that extends through it that permits light to move through each orifice 40,42,44. Preferably, each orifice 40,42,44 is centrally located on the associated dividing wall 65,66,67. Preferably, each dividing wall 65,66,67 is covered with a non-light absorbing material.

The first dividing wall 65 is positioned towards the first end 61 of the container 60. The third dividing wall 67 is positioned towards the second end 62 of the container 60. The second dividing wall 66 is positioned between the first dividing wall 65 and the third dividing wall 67. Preferably, as shown in FIG. 1, the second dividing wall 66 is positioned towards the first dividing wall 65.

An outlet compartment 20 is defined in the cavity of the container 60 between the first dividing wall 65 and the first end 61 of the container 60. A staging compartment 22 is defined in the cavity of the container 60 between the first dividing wall 65 and the second dividing wall 66. A middle compartment 24 is defined in the cavity of the container 60 between the second dividing wall 66 and the third dividing wall 67. An inlet compartment 26 is defined in the cavity of the container 60 between the third dividing wall 67 and the second end 62 of the container 60.

The second end 62 of the container 60 has an aperture 46 extending through it to permit introduction of light into the inlet compartment 26.

A light-transferring means 58 extends through the aperture 46 in the second end 62 of the container 60. The light-transferring means 58 transfers light from a light source 1 into the cavity of the container 60. The light-transferring means 58 comprises at least one optical fiber, but preferably comprises many optical fibers. Preferably, the light-transferring means 58 introduces light into the inlet compartment 26. Also preferably, the light-transferring means 58 resists passage of light out of the cavity of the container 60.

Preferably, a plurality of tubes 50 extend between the first dividing wall 65 and the second dividing wall 66 to connect the orifice 40 of the first dividing wall 65 and the orifice 42 of the second dividing wall 66. Each of the tubes 50 has a hollow interior, a first end 52, and a second end 54. The first end 52 of each of the tubes 50 is positioned towards the first end 61 of the container 60. Each of the tubes 50 has a magnifying lens 56 in the interior or the tube that is positioned towards the first end 52 of the tube 50. Each of the magnifying lenses 56 focuses light on at least one photoelectric cell 15. Preferably, each tube 50 has an inner surface 55 that is covered with a non-light absorbing material.

A plurality of photoelectric cells 15 that convert light into electricity are provided in the outlet compartment 20 adjacent the first end 61 of the container 60.

A first shutter 30 selectively opens and closes the orifice 40 in the first dividing wall 65. The first shutter 30 is selectively positionable between an open position and a closed position. The first shutter 30 permits the flow of light from the tubes 50, or the staging compartment 22 if no tubes 50 are used, into the outlet compartment 20 of the container 60 when the first shutter 30 is in the open position. The first shutter 30 resists the flow of light from the tubes 50 into the outlet compartment 20 of the container 60 when the first shutter 30 is in the closed position.

A second shutter 32 selectively opens and closes the orifice 42 in the second dividing wall 66. The second shutter 32 is selectively positionable between an open position and a closed position. The second shutter 32 permits the flow of light from the middle compartment 24 of the container 60 into the tubes 50, or the staging compartment 22 when no tubes 50 are used, when the second shutter 32 is in the open position. The second shutter 32 resists the flow of light from the middle compartment 24 of the container 60 into the tubes 50 when the second shutter 32 is in the closed position.

A third shutter 34 selectively opens and closes the orifice 44 in the third dividing wall 67. The third shutter 34 is selectively positionable between an open position and a closed position. The third shutter 34 permits the flow of light from the inlet compartment 26 into the middle compartment 24 of the container 60 when the third shutter 34 is in the open position. The third shutter 34 resists the flow of light from the inlet compartment 26 into the middle compartment 24 of the container 60 when the third shutter 34 is in the closed position. Preferably, the third shutter 34 is covered with a non-light absorbing material.

Preferably, the first, second and third shutters 30,32,34 have are covered with a non-light absorbing material.

Preferably, first, second, and third controllers 68,69,70 are operatively connected to the first, second, and third shutters 30,32,34. The controllers 68,69,70 permit remote opening and closing of the first, second, and third shutters 30,32,34.

If the controllers 68,69,70 are disposed within the cavity of the container 60, each of the controllers 68,69,70 is covered with a non-light absorbing material.

An inlet shutter 36 selectively permits and prevents passage of light from the light-transferring means 58 into the inlet compartment 26. The inlet shutter 36 is preferably positioned adjacent the aperture 46 in the second end of the container 60. Alternatively, the inlet shutter 36 may be positioned in the light-transferring means 58 to selectively permit and prevent the passage of light through the light-transferring means 58. Preferably, the inlet shutter is covered with a non-light absorbing material.

A light density measuring device 17 extends into the middle compartment 24 at light density middle compartment opening 18. The light density measuring device 17 measures the amount of light energy currently being held in the middle compartment 24.

A light density meter 19 is operatively connected to the light density measuring device 17. The light density meter 19 displays a visual measurement of the amount of light energy in the middle compartment 24. Preferably, the light density meter 19 has a numerical display indicating the amount of light energy in the middle compartment 24.

Optionally, a fourth controller (not shown) permits remote opening and closing of the inlet shutter 36. The third and fourth controllers 70,(not shown) may be operatively coupled to the light density meter 19. The third and fourth controllers 70,(not shown) opens the third and inlet shutters 34,36 when the measurement indicated by the light density meter 19 falls below a predetermined level, allowing light to enter the middle compartment 24. When the density of light inside the middle compartment 24 reaches the predetermined level, the third and fourth controllers close the third and inlet shutters 34,36.

A plurality of valved openings 48 are included in the optical cavity device 10. One valved opening 48 opens into the middle compartment 24. Another valved opening 48 opens into the outlet compartment 20. Another valved opening 48 opens into the staging compartment 22. Another valved opening 48 opens into the inlet compartment 26. The valved openings 48 are designed to permit removal of air from the compartments 20,22,24,26 or to introduce a gas into the respective compartments 20,22,24,26.

In use, the light-transferring means 58 is positioned towards a light source 1 such that light from the light source 1 may be transferred to the inlet compartment 26 by the light-transferring means 58. The inlet shutter 36 is opened to permit transfer of light from the light source 1 through the light-transferring means 58 and into the inlet compartment 26. The third shutter 34 is opened to permit light to enter the middle compartment 24. Light is allowed to enter the middle compartment 24.

Electricity is desired to be produced, the second shutter 32 is opened to permit light from the middle compartment 24 to enter the tubes 50. The second shutter 32 is closed, trapping a quantity of light in the tubes 50 between the first shutter 30 and the second shutter 32. The first shutter 30 is opened to permit the quantity of light to move out of the tubes 50 and into the outlet compartment 20 where the light is converted into electricity by the photoelectric cells 15. The light is magnified by the magnifying tenses 56 in the tubes 50. The procedure of opening and closing the second then first shutters 32,30 produces a controlled amount of electricity by permitting conversion of only the quantity of light that is trapped in the tubes 50. This procedure is repeated continuously until electricity is no longer needed.

As to a further discussion of the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

I claim:

1. An optical cavity device for converting concentrated light into electricity, said optical cavity device comprising:

a middle compartment having an interior with substantially all air removed therefrom such that a very high vacuum condition exists in said interior for minimizing the dissipation of light moving in said interior, said middle compartment having an aperture for permitting passage of light into the interior of said middle compartment, said middle compartment having an inlet shutter for selectively opening and closing said aperture of said middle compartment for selectively permitting and blocking light passage through said aperture into the interior of said middle compartment, said middle compartment having a non-light absorbing inner surface for retaining light in the interior of the middle compartment;

an outlet compartment having an interior;

a passage connecting the interior of said middle compartment and the interior of said outlet compartment together;

a first shutter for selectively opening and closing said passage;

wherein said middle compartment has an aperture to permit passage of light into said middle compartment;

an inlet shutter for selectively opening and closing said aperture of said middle compartment; and a plurality of photoelectric cells located in said outlet compartment for converting into electrical energy light passing through said passage from said middle compartment to said outlet compartment when said first shutter is opened.

2. The optical cavity device of claim 1, wherein said passage connecting said outlet compartment and said middle compartment comprises a staging compartment, wherein a first orifice connects said outlet compartment and said staging compartment, wherein a second orifice connects said middle compartment and said staging compartment.

3. The optical cavity device of claim 1, wherein said passage connecting said outlet compartment and said middle compartment comprises a tube.

4. The optical cavity device of claim 1, wherein said passage connecting said outlet compartment and said middle compartment comprises a plurality of tubes.

5. The optical cavity device of claim 4, wherein each of said tubes has a first end, a second end, and a hollow interior, said first end of each of said tubes being positioned towards said photoelectric cells, each of said tubes having a magnifying lens therein being positioned towards said first end of each of said tubes.

6. The optical cavity device of claim 2, further comprising a second shutter for selectively opening and closing said second orifice, said first shutter being adapted to selectively open and close said first orifice.

7. The optical cavity device of claim 1, further comprising a wall defining a portion of said middle compartment as an inlet compartment, said wall having an aperture extending therethrough, said inlet compartment being positioned away from said outlet compartment.

8. The optical cavity device of claim 1, further comprising a light density measuring device for measuring light density.

9. The optical cavity device of claim 1, further comprising a plurality of valved openings, one of said valved openings opening into the interior of said middle compartment, another one of said valved openings opening into the interior of said outlet compartment.

10. The optical cavity device of claim 1, further comprising a light-transferring means for transferring light from a light source into said middle compartment, said light-transferring means extending through said aperture in said middle compartment.

11. The optical cavity device of claim 10, wherein said light-transferring means comprises at least one optical fiber.

12. The optical cavity device of claim 1, wherein said middle and outlet compartment and said passage each have non-light absorbing inner surfaces, wherein said inner surfaces of said middle and outlet compartments and said inner surface of said passage are covered with a non-light absorbing material, and wherein said first and inlet shutters each have non-light absorbing surfaces.

13. An energy conversion device comprising:
 a middle compartment having an interior with substantially all air removed therefrom such that a very high vacuum condition exists in said interior for minimizing the dissipation of light moving in said interior, said middle compartment having an aperture for permitting the passage of light into the interior of said middle compartment, said middle compartment having an inlet shutter for selectively opening and closing said aperture of said middle compartment for selectively permitting and blocking light passage through said aperture into the interior of said middle compartment, said middle compartment having a non-light absorbing inner surface for retaining light in the interior of the middle compartment;
 an outlet compartment having an interior;
 a passage connecting the interior of said middle compartment to the interior of said outlet compartment;
 a first shutter for selectively opening and closing said passage for selectively permitting and blocking light passage through said passage from said middle compartment into said outlet compartment; and
 a plurality of photoelectric cells located in said outlet compartment for converting into electrical energy light passing through said passage from said middle compartment to said outlet compartment when said first shutter is opened.

14. The energy conversion device of claim 13, wherein said passage connecting said outlet compartment and said middle compartment comprises a staging compartment, wherein a first orifice connects said outlet compartment and said staging compartment, wherein a second orifice connects said middle compartment and said staging compartment.

15. The energy conversion device of claim 13, wherein said passage connecting said outlet compartment and said middle compartment comprises a tube, said tube having a magnifying lens proximate to said outlet compartment to disperse the light traveling through said tube into said outlet compartment.

16. The energy conversion device of claim 15, wherein said tube has a first end, a second end, and a hollow interior, said first end of said tube being positioned towards said photoelectric cells, said tube having a magnifying lens therein being positioned towards said first end of said tube.

17. The energy conversion device of claim 13, further comprising a second shutter for selectively opening and closing said second orifice.

18. The energy conversion device of claim 13, further comprising a light density measuring device in optical communication with the interior of said middle compartment for measuring the light density in the interior of said middle compartment.

19. The energy conversion device of claim 13, further comprising a plurality of valved openings, one of said valved openings opening into the interior of said middle compartment, another one of said valved openings opening into the interior of said outlet compartment.

20. The energy conversion device of claim 13, wherein said outlet compartment and said passage each have non-light absorbing inner surfaces, and wherein said first and inlet shutters have a non-light absorbing surface.

21. An optical cavity device for converting concentrated light into electricity, said optical cavity device comprising:
 a container having opposite first and second ends and inner and outer surfaces;
 said inner surface of said container defining a cavity;
 first, second, and third dividing walls being disposed in said cavity;
 each of said dividing walls having an orifice extending therethrough, each orifice being centrally located on the associated dividing wall;
 wherein said inner surface of said container and each of said dividing walls are covered with a non-light absorbing material;
 said first dividing wall being positioned towards said first end of said container;
 said third dividing wall being positioned towards said second end of said container;
 said second dividing wall being positioned between said first dividing wall and said third dividing wall;
 an outlet compartment being defined in said cavity of said container between said first dividing wall and said first end of said container;
 a staging compartment being defined in said cavity of said container between said first dividing wall and said second dividing wall;
 a middle compartment being defined in said cavity of said container between said second dividing wall and said third dividing wall;
 an inlet compartment being defined in said cavity of said container between said third dividing wail and said second end of said container;
 wherein said second end of said container has an aperture extending therethrough;
 a light-transferring means for transferring light from a light source into said cavity of said container, said light-transferring means being extended through said aperture in said second end of said container, wherein said light-transferring means comprises at least one optical fiber;

a plurality of tubes connecting said orifice of said first dividing wall and said orifice of said second dividing wall, said tubes being extended between said first dividing wall and said second dividing wall, each of said tubes having a hollow interior, a first end, and a second end, wherein said first end of each of said tubes is positioned towards said first end of said container;

wherein each of said tubes has a magnifying lens therein being positioned towards said first ends of said tubes;

a plurality of photoelectric cells being provided in said outlet compartment adjacent said first end of said container;

first, second, and third shutters for selectively opening and closing said orifices in said first, second, and third dividing walls;

an inlet shutter for selectively permitting and preventing passage of light through said light-transferring means;

a light density measuring device for measuring light density in said middle compartment;

a light density meter being operatively connected to said light density measuring device; and a plurality of valved openings into said cavity of said container, each of said valved openings being opened into a respective said compartment of said cavity of said container.

* * * * *